(12) United States Patent
Johnson et al.

(10) Patent No.: US 7,307,123 B2
(45) Date of Patent: Dec. 11, 2007

(54) PHOTOCURABLE COMPOSITIONS CONTAINING REACTIVE PARTICLES

(75) Inventors: David Johnson, Los Angeles, CA (US); John Wai Fong, Los Angeles, CA (US)

(73) Assignee: Huntsman Advanced Materials Americas Inc., The Woodlands, TX (US)

( * ) Notice: Subject to any disclaimer, the term of this patent is extended or adjusted under 35 U.S.C. 154(b) by 244 days.

(21) Appl. No.: 10/511,924

(22) PCT Filed: Apr. 18, 2003

(86) PCT No.: PCT/EP03/04231

§ 371 (c)(1),
(2), (4) Date: Oct. 18, 2004

(87) PCT Pub. No.: WO03/089991

PCT Pub. Date: Oct. 30, 2003

(65) Prior Publication Data

US 2005/0175925 A1    Aug. 11, 2005

Related U.S. Application Data

(63) Continuation-in-part of application No. 10/125,508, filed on Apr. 19, 2002, now abandoned.

(51) Int. Cl.
*C08L 63/00* (2006.01)
*C08F 2/46* (2006.01)

(52) U.S. Cl. .................. 525/65; 428/515; 430/270.1; 522/1; 524/731; 556/462

(58) Field of Classification Search ............. 525/65
See application file for complete search history.

(56) References Cited

U.S. PATENT DOCUMENTS

| 5,002,854 | A  | * | 3/1991  | Fan et al. ............... 430/270.1 |
| 5,461,088 | A  | * | 10/1995 | Wolf et al. ............... 522/103 |
| 5,476,748 | A  | * | 12/1995 | Steinmann et al. ......... 430/269 |
| 5,707,773 | A  | * | 1/1998  | Grossman et al. .......... 430/138 |
| 6,210,854 | B1 | * | 4/2001  | Grossman et al. .......... 430/138 |
| 6,287,745 | B1 | * | 9/2001  | Yamamura et al. ......... 430/269 |
| 6,685,869 | B2 | * | 2/2004  | Yamamura et al. ......... 264/401 |
| 2001/0046642 | A1 | * | 11/2001 | Johnson et al. .......... 430/280.1 |
| 2002/0132872 | A1 | * | 9/2002  | Yamamura et al. ........... 522/15 |

\* cited by examiner

*Primary Examiner*—Randy Gulakowski
*Assistant Examiner*—John J. Figueroa

(57) ABSTRACT

A photocurable composition, including (a) a photocurable monomer, e.g. a cationically curable monomer and/or a radically curable monomer; (b) reactive particles comprising a crosslinked elastomeric core, e.g. made of polysiloxane material, and a shell of reactive groups on an outer surface of the core, wherein the reactive groups comprise epoxy groups, ethylenically unsaturated groups, or hydroxy groups; and (c) an appropriate photoinitiator, e.g. a radical photoinitiator; and a cationic photoinitiator. A method of making a 3-D object from such a composition and a 3-D object made by the method are also provided. The cured composition generally has a smooth surface. The use of the reactive particles makes the composition more stable and the particles do not readily separate out.

14 Claims, No Drawings

PHOTOCURABLE COMPOSITIONS CONTAINING REACTIVE PARTICLES

CROSS REFERENCES TO RELATED APPLICATIONS

This is a continuation-in-part of U.S. patent application Ser. No. 10/125,508, filed Apr. 19, 2002, now abandoned. The noted application is incorporated herein by reference.

BACKGROUND OF THE INVENTION

1. Field of the Invention

The invention relates to photocurable compositions, more particularly to photocurable compositions for stereolithography.

2. Related Art

U.S. Pat. No. 5,002,854 to Fan et al. discloses a photohardenable composition for stereolithography containing filler particles that are core shell polymers. The core is a crosslinked multifunctional ethylenically unsaturated monomer; the shell is based on a monofunctional ethylenically unsaturated monomer. The particles are non-reactive and do not chemically bond to the polymer matrix formed on curing the composition.

U.S. Pat. No. 5,461,088 to Wolf et al. discloses a stereolithography formulation containing a polysiloxane block copolymer that is added to the formulation as an oil or crystals. The block copolymer is not a core-shell polymer and contains no reactive epoxy groups or ethylenically unsaturated groups. U.S. Pat. No. 5,463,084 to Crivello et al. discloses a photocurable composition containing silicone oxetane monomers that are liquid. U.S. Pat. No. 5,639,413 to Crivello discloses a photocurable composition containing a cyclohexylepoxy siloxane monomer that is liquid.

3-D objects made by stereolithography are generally clear or slightly hazy, and tend to have rough surfaces. Opaque white objects with smooth surfaces are desirable as similar to plastic objects made by non-stereolithography processes. Smooth sidewalls are especially useful when using an object prepared from stereolithography as a model to prepare a mold. There is therefore a need for alternative photocurable compositions for stereolithography to allow for variation in color, opacity, and surface properties. In particular, there is a need for stereolithography compositions that form opaque white or colored objects with improved surface properties.

In stereolithography, the usual way of producing opaque materials is to add fillers: fillers will often settle out over time and their incorporation into photopolymerisable composition generally requires the composition to be repeatedly homogenized, e.g. by stirring.

SUMMARY OF THE INVENTION

The invention provides a photocurable composition, including (a) a photocurable monomer, preferably a cationically curable monomer and/or a radically curable monomer, (b) reactive particles comprising a crosslinked elastomeric core, the elastomer preferably comprising polysiloxane, and a shell of reactive groups on an outer surface of the core, wherein the reactive groups comprise epoxy groups, ethylenically unsaturated groups, or hydroxy groups; and (c) a photoinitiator for the monomer, e.g. a radical photoinitiator and/or a cationic photoinitiator.

The invention also provides a method of making a 3-D object from such a composition by forming a first layer of the photocurable composition; exposing the first layer to actinic radiation sufficient to harden the first layer; forming a second layer of the photocurable composition above the hardened first layer; exposing the second layer to actinic radiation sufficient to harden the second layer; and repeating the previous two steps as needed to form a 3-D object.

Unusually for a composition containing fillers, 3D objects formed from the composition will generally have smooth or even glossy walls.

Embodiments of the present invention allows photocured objects to be made that are opaque; in addition, the reactive fillers, significantly siloxane reactive fillers, are very well integrated with the other ingredients of typical photocurable resins so that the requirement to homogenize resins constantly during use is substantially reduced.

The composition can include dyes and pigments e.g. for making the compositions colored when desired, for example for use as housings for hearing aids with a smooth flexible feel for the human user.

DETAILED DESCRIPTION OF THE INVENTION

"Stereolithography" is a process that produces solid objects from computer-aided design ("CAD") data CAD data of an object is first generated and then is sliced into thin cross sections. A computer controls a laser beam that traces the pattern of a slice through a liquid plastic, solidifying a thin layer of the plastic corresponding to the slice. The solidified layer is recoated with liquid plastic and the laser beam traces another slice to harden another layer of plastic on top of the previous one. The process continues layer by layer to complete the part A desired part may be built in a matter of hours. This process is described in U.S. Pat. No. 5,476,748 to Steinmann et al., U.S. Patent Publication No. 2001/0046642 to Johnson et al., and by Jacobs in "Rapid Prototyping & Manufacturing" (Society of Manufacturing Engineers, 1992), the entire contents of which documents are incorporated herein by reference.

"3-D object" means a three-dimensional object made from at least two layers of a cured resin composition.

"Polymerization" is a chemical reaction linking monomers to form larger molecules. The resulting polymers have units that correspond to the monomers.

A "monomer" is a compound that is capable of polymerizing with other monomers to form a polymer chain or matrix. The term "monomer" refers to compounds with one or more reactive groups and includes oligomers that are, e.g., dimers or trimers formed from two or three monomer units, respectively.

"Crosslinked" means a polymer that contains bonds between atoms of two or more different polymer chains. The result is a matrix that develops rigidity because the polymer chains are bonded together and can not flow freely. Crosslinked polymers generally result from polymerizing monomers that have more than one reactive site, i.e., the monomers are polyfunctional.

"Curing" means to polymerize a mixture including one or more monomers and one or more initiators. "Hardening" may be synonymous with curing and emphasizes that when polymerized, liquid monomer mixtures tend to become solid.

"Photocurable composition" means a composition that may be cured or hardened by a polymerization reaction that is initiated by actinic radiation.

"Actinic radiation" is light energy at a wavelength that allows a given chemical compound to absorb the light energy and form a reactive species. For stereolithography, typically a laser beam or a flood lamp generates the actinic radiation.

"Cationically curable" means a monomer that can polymerize by cationic polymerization, a mechanism that involves cations, i.e., chemical species that are positively charged.

"Radically curable" means a monomer that can polymerize by radical polymerization, a mechanism that involves radicals, i.e., chemical species with an unpaired valence electron.

"Photoinitiator" is a compound that absorbs actinic radiation to form a reactive species that initiates a chemical reaction such as polymerization.

A "cationic photoinitiator" is a photoinitiator that generates cations when exposed to actinic radiation and thereby initiates cationic polymerization.

A "radical photoinitiator" is a photoinitiator that generates radicals when exposed to actinic radiation and thereby initiates radical polymerization.

"(Meth)acrylate" refers to an acrylate, methacrylate, or a combination thereof.

"Hybrid composition" means a photocurable composition with at least one radically curable component and at least one cationically curable component.

"Jetting" means the application of droplets of a liquid at targeted locations on a substrate to build up a deposit of a desired shape; this can be achieved by means of a jet printing head, e.g. a piezoelectric jet printing head. Each liquid droplet can contain all or only some of the components of a curable resin system. If only some components are present in each droplet, the remaining components can be provided in other droplets directed at the same target location or in a liquid or powder layer already applied on the substrate.

A. Cationically Curable Monomer

Examples of cationically curable monomers are disclosed in, e.g., U.S. Pat. No. 5,476,748 and U.S. Patent Publication No. 2001/0046642 A1, both incorporated herein by reference.

The photocurable composition preferably contains from 15 to 80% by weight of cationically curable monomer, more preferably from 50 to 75% by weight.

The cationically curable monomer may include one or more epoxide compounds in which the epoxide groups form part of an alicyclic or heterocyclic ring system. The alicyclic epoxide preferably includes at least one alicyclic polyepoxide having at least two epoxy groups per molecule. Preferably, the alicyclic polyepoxide is in a relatively pure form in terms of oligomer (e.g. dimer, trimer, etc.) content. Preferably, the alicyclic polyepoxide has a monomer purity of over about 90%, more preferably over about 94%, even more preferably 98% or higher. Ideally, dimers or trimers or higher oligomers are substantially eliminated. Preferably, the alicyclic polyepoxide has an epoxy equivalent weight from 80 and 330, more preferably from 90 and 300, even more preferably from 100 and 280.

Examples of alicyclic polyepoxides include bis(2,3-epoxycyclopentyl) ether, 2,3-epoxycyclopentyl glycidyl ether, 1,2-bis(2,3-epoxycyclopentyloxy)ethane, bis(4-hydroxycyclohexyl)methane diglycidyl ether, 2,2-bis(4-hydroxycyclohexyl)propane diglycidyl ether, 3,4-epoxycyclohexylmethyl 3,4-epoxycyclohexanecarboxylate, 3,4-epoxy-6-methylcyclohexylmethyl 3,4-epoxy-6-methylcyclohexanecarboxylate, di(3,4-epoxycyclohexylmethyl) hexanedioate, di(3,4-epoxy-6-methylcyclohexylmethyl) hexanedioate, ethylene bis(3,4-epoxycyclohexanecarboxylate, ethanediol di(3,4-epoxycyclohexylmethyl) ether, vinylcyclohexene dioxide, dicyclopentadiene diepoxide or 2-(3,4-epoxycyclohexyl-5,5-spiro-3,4-epoxy)cyclohexane-1,3-dioxane.

3,4-epoxycyclohexylmethyl 3',4'-epoxycyclohexanecarboxylate having an epoxy equivalent weight from 130 and 145 with varying degrees of monomer purity are commercially available. Araldite CY179 of Ciba Speciality Chemicals has monomer purity of about 90%. UVR6105 of DOW Corp. contains a smaller percentage of oligomers and thus has higher monomer purity than Araldite CY 179. Preferred is Uvacure 1500 of UCB Radcure Corp., which has monomer purity of about 98.5%.

The photocurable composition preferably contains from 5 to 80% by weight, more preferably from 10 and 75% by weight, even more preferably from 15 to 70% by weight of alicyclic polyepoxide.

The component (a) may include a monomer with at least one epoxycyclohexyl group that is bonded directly or indirectly to a group containing at least one silicon atom. These monomers may be linear, branched, or cyclic in structure. Examples are disclosed in U.S. Pat. No. 5,639,413, which is incorporated herein by reference.

The photocurable composition preferably includes one or more cationically curable compounds that are polyglycidyl ethers, poly(β-methylglycidyl) ethers, polyglycidyl esters, poly(β-methylglycidyl) esters, poly(N-glycidyl) compounds, and poly(S-glycidyl) compounds. Suitable cationically curable oxetanes are disclosed in U.S. Pat. No. 5,463,084 and U.S. Pat. No. 6,121,342 (especially those defined by structure IV); both of which are incorporated herein by reference.

Polyglycidyl ethers can be obtained by reacting a compound having at least two free alcoholic hydroxyl groups and/or phenolic hydroxyl groups with a suitably substituted epichlorohydrin under alkaline conditions or in the presence of an acidic catalyst followed by alkali treatment. Ethers of this type may be derived, for example, from acyclic alcohols, such as ethylene glycol, diethylene glycol and higher poly(oxyethylene) glycols, propane-1,2-diol, or poly(oxypropylene) glycols, propane-1,3-diol, butane-1,4-diol, poly(oxytetramethylene) glycols, pentane-1,5-diol, hexane-1,6-diol, hexane-2,4,6-triol, glycerol, 1,1,1-trimethylolpropane, bistrimethylolpropane, pentaerythritol, sorbitol, and from polyepichlorohydrins. Suitable glycidyl ethers can also be obtained from cycloaliphatic alcohols such as 1,3- or 1,4-dihydroxycyclohexane, bis(4-hydroxycyclohexyl)methane, 2,2-bis(4-hydroxycyclohexyl)propane or 1,1-bis(hydroxymethyl)cyclohex-3-ene, or aromatic alcohols such as N,N-bis(2-hydroxyethyl)aniline or p,p'-bis(2-hydroxyethylamino)diphenylmethane, bisphenol A, F, and S resins, phenyl and cresol novolak resins, and 4,4'-oxybisphenol.

Examples of preferred polyglycidyl ethers include trimethylolpropane triglycidyl ether, triglycidyl ether of polypropoxylated glycerol, and diglycidyl ether of 1,4-cyclohexanedimethanol.

The following are examples of commercially available cationically curable monomers: Uvacure 1500, Uvacure 1501, Uvacure 1502 (1501 and 1502 have been discontinued by UCB), Uvacure 1530, Uvacure 1531, Uvacure 1532, Uvacure 1533, Uvacure 1534, Uvacure 1561, Uvacure 1562, all commercial products of UCB Radcure Corp., Smyrna, GA; UVR-6100, UVR-6105, UVR-6110, UVR-6128, UVR-6200, UVR-6216 of DOW Corp.; the Araldite GY series that is Bisphenol A epoxy liquid resins, the Araldite CT and GT series that is Bisphenol A epoxy solid resins, the Araldite GY and PY series that is Bisphenol F epoxy liquids, the cycloaliphatic epoxides Araldite CY 177, CY 179 and PY 284, the Araldite DY and RD reactive diluents series, the Araldite ECN series of epoxy cresol novolacs, the Araldite EPN series of epoxy phenol novolacs, all commercial products of Ciba Specialty Chemicals Corp., the Heloxy 44, Heloxy 48, Heloxy 84, Heloxy 107, and others in the Heloxy product line, the EPON product line, all of Resolution Performance Products (Houston, Tex.), the DER series of flexible aliphatic and Bisphenol A liquid or solid epoxy resins, the DEN series of epoxy novolac resins, all commercial products of Dow Corp.; Celoxide 2021, Celoxide 2021P, Celoxide 2081, Celoxide 2083, Celoxide 2085, Celoxide 2000, Celoxide 3000, Glycidole, AOEX-24, Cyclomer A200, Cyclomer M-100, Epolead GT-300, Epolead GT-302, Epolead GT-400, Epolead 401, Epolead 403, (Daicel Chemical Industries Co., Ltd.), Epotuf 37-138, Epotuf 37-153, Epotuf 37-962 (Reichold Inc.), Epicoat 828, Epicoat 812, Epicoat 872, Epicoat CT 508 (Yuka Shell Co., Ltd.), Glydexx N-10 (Exxon-Mobile), KRM-2100, KRM-2110, KRM-2199, KRM-2400, KRM-2410, KRM-2408, KRM-2490, KRM-2200, KRM-2720, KRM-2750 (Asahi Denka Kogyo Co., Ltd.).

The cationically curable monomer may include compounds containing vinyl ether groups. Preferred examples are aliphatic polyalkoxy di(poly)vinylethers, polyalkylene di(poly)vinylethers, and hydroxy-functionalized mono(poly)vinylethers. More preferred vinylethers are those having aromatic or alicyclic moieties in their molecules. Preferably, the vinylether component is from 0.5 to 20% by weight of the photocurable composition. More preferably the vinylether component is from 2 to 17% by weight. Even more preferably, the vinyl ether component is from 3 to 14% by weight.

Examples of vinyl ethers include ethyl vinylether, n-propyl vinylether, isopropyl vinylether, n-butyl vinylether, isobutyl vinylether, octadecyl vinylether, cyclohexyl vinylether, butanediol divinylether, cyclohexanedimethanol divinylether, diethyleneglycol divinylether, triethyleneglycol divinylether, tert-butyl vinylether, tert-amyl vinylether, ethylhexyl vinylether, dodecyl vinylether, ethyleneglycol divinylether, ethyleneglycolbutyl vinylether, hexanediol divinylether, triethyleneglycol methylvinylether, tetraethyleneglycol divinylether, trimethylolpropane trivinylether, aminopropyl vinylether, diethylaminoethyl vinylether, ethylene glycol divinyl ether, polyalkylene glycol divinyl ether, alkyl vinyl ether and 3,4-dihydropyran-2-methyl 3,4-dihydropyran-2-carboxylate. Examples of commercial vinyl ethers include the Pluriol-E200 divinyl ether (PEG200-DVE), poly-THF290 divinylether (PTHF290-DVE) and polyethyleneglycol-520 methyl vinylether (MPEG500-VE) all of BASF Corp.

Examples of hydroxy-functionalized mono(poly)vinylethers include polyalkyleneglycol monovinylethers, polyalkylene alcohol-terminated polyvinylethers, butanediol monovinylether, cyclohexanedimethanol monovinylether, ethyleneglycol monovinylether, hexanediol monovinylether, and diethyleneglycol monovinylether.

Further examples of vinyl ethers are disclosed in U.S. Pat. No. 5,506,087, incorporated herein by reference.

Examples of commercial vinyl ethers include Vectomer 4010 (HBVE isophthalate), Vectomer 4020 (pentanedioic acid, bis[4-[(ethenyloxy)methyl]cyclohexyl]methyl]ester), Vectomer 4051 (CHMVE terephthalate), Vectomer 4060 (vinyl ether terminated aliphatic ester monomer: HBVE adipate), and Vectomer 5015 (tris(4-vinyloxybutyl)trimellitate), all of Morflex, Inc., Greensboro, N.C. Preferred vinyl ethers are Vectomer 4010 and Vectomer 5015.

The photocurable composition of the invention may include mixtures of the cationically curable compounds described above.

B. Radically Curable Monomer

The radically curable monomer (b) of the invention is preferably ethylenically unsaturated. More preferably, the monomer is a (meth)acrylate. The monomer may include at least one poly(meth)acrylate, e.g., a di-, tri-, tetra- or pentafunctional monomeric or oligomeric aliphatic, cycloaliphatic, or aromatic (meth)acrylate. The poly(meth)acrylate preferably has a molecular weight of from 200 to 500.

Examples of di(meth)acrylates include di(meth)acrylates of cycloaliphatic or aromatic diols such as 1,4-dihydroxymethylcyclohexane, 2,2-bis(4-hydroxycyclohexyl)propane, 1,4-cyclohexanedimethanol, ethoxylated or propoxylated 1,4-dihydroxymethylcyclohexane, bis(4-hydroxycyclohexyl)methane, hydroquinone, 4,4'-dihydroxybiphenyl, Bisphenol A, Bisphenol F, bisphenol S, ethoxylated or propoxylated Bisphenol A, ethoxylated or propoxylated Bisphenol F, and ethoxylated or propoxylated bisphenol S. Di(meth)acrylates of this kind are known and some are commercially available, e.g., Ebecryl 3700 (UCB Chemicals), SR 348, SR 349 (Sartomer Chemical Co).

The di(meth)acrylate may include difunctional urethane (meth)acrylates and their oligomers. Urethane (meth)acrylates can be prepared by, e.g., reacting a hydroxyl-terminated polyurethane with acrylic acid or methacrylic acid, or by reacting an isocyanate-terminated prepolymer with hydroxyalkyl (meth)acrylates to give the urethane (meth)acrylate. Urethane (meth)acrylates of this kind are known and some are commercially available, e.g., Ebecryl 230, Ebecryl 270, Ebecryl 4833, and Ebecryl 8302 (UCB Radcure).

The di(meth)acrylate may be acyclic aliphatic, rather than cycloaliphatic or aromatic. Di(meth)acrylates of this kind are known. Examples are polyethyleneoxy-, polypropyleneoxy-, and polytetramethylenoxy di(meth)acrylate and compounds of the formulae (F-V) to (F-VIII) of U.S. Pat. No. 6,413,697. Their preparation is also described in EP-A-0 646 580 and the contents of these two specifications are incorporated herein by reference. Compounds of the formulae (F-I) to (F-IV) of U.S. Pat. No. 6,413,697 are further examples of di(meth)acrylates which can be employed in the present invention. These compounds of the formulae (F-I) to (F-VIII) are known and some are commercially available.

Further examples of (meth)acrylates that can be used in accordance with the present invention are set out in the following Table 1:

TABLE 1

| functional groups | components |
|---|---|
| | 1. Aliphatic |
| 1 | Allyl (meth)acrylate<br>methyl (meth)acrylate |

TABLE 1-continued

| functional groups | components |
|---|---|
| | Ethyl (meth)acrylate |
| | 2-hydroxyethyl (meth)acrylate |
| | 2- and 3-hydroxypropyl (meth)acrylate |
| | 2-methox ethyl (meth)acrylate |
| | 2-ethoxy ethyl (meth)acrylate |
| | 2- or 3-ethoxyl propyl(meth)acrylate |
| | Tetrahydrofurfuryl (meth)acrylate |
| | 2-(2-ethoxyethoxy)ethyl (meth)acrylate |
| | Cyclohexyl (meth)acrylate |
| | 2-phenoxy ethyl (meth)acrylate |
| | Glycidyl (meth)acrylate |
| | Isodecyl (meth)acrylate |
| 2 | Diethylene glycol diacrylate (SR 230) |
| | diethylene glycol dimethacrylate (SR 231) |
| | triethylene glycol diacrylate ( |
| | triethylene glycol dimethacrylate (SR 205) |
| | tetraethylene glycol diacrylate (SR 268) |
| | tetraethylene glycol dimethacrylate (SR 209) |
| | polyethylene glycol diacrylate (SR 344) |
| | polyethylene glycol dimethacrlyate (SR 252) |
| | Neopentyl glycol diacrylate (SR 247) |
| | Neopentyl glycol dimethacrylate (Pleximon V 773) |
| | Ethoxylated or propoxylated neopentyl glycol di(meth)acrylate |
| | Hexane diol diacrylate (SR 238) |
| | 1,4-dihydroxymethylcyclohexane, 2,2-bis(4-hydroxy-cyclohexyl)methane |
| 3 | Trimethylol propane triacrylate (SR 351) |
| | ethoxylated or propoxylated glycerol triacrylate |
| | ethoxylated 1,1,1-trimethylol propane triacrylate (SR 454) |
| | propoxylated 1,1,1-trimethylol propane trimethacrlate (SR 492) |
| | (meth)acrylate of triglycidyl ether of glycols |
| | Pentaerythritol monohydroxy triacrylate (SR 444) |
| | Pentaerythritol monohydroxy trimethacrylate (NK Ester TMM 360) |
| | Hexane 2,4,6-triol tri(meth)acrylate |
| 4 | Pentaerythritol tetraacrylate (SR 295) |
| | Ethoxylated pentaerythritol tetraacrylate (SR 494) |
| | Bis trimethylolpropane tetraacrylate (SR 355) |
| | Tetramethylolpropane tetracrylate (SR 367) |
| 5 | Dipentaerythritol monohydroxy pentaacrylate (SR 399, SR 9041) |
| 6 | dipentaerythritol hexaacrylate (NK-Ester A-9530) |
| | Hexafunctional urethane (meth)acrylates |
| Other | Hydroxy terminated polyurethane with (meth)acrylic acid |
| | 2. Aromatic: |
| 1 | |
| 2 | Bisphenol A diacrylate (DER 331) |
| | Bisphenol F diacrylate |
| | Bisphenol S diacrylate |
| | Bisphenol A dimethacrylate (Ebecryl 610) |
| | Bisphenol F dimethacrylate |
| | Bisphenol S dimethacrylate |
| | Ethoxylated or propoxylated bisphenol A di(meth)acrylate |
| | Ethoxylated bisphenol A diacrylate (SR 346) |
| | Propoxylated bisphenol A diacrylate (Ebecryl 150) |
| | Ethoxylated bisphenol A dimethacrylate (SR 348) |
| | Propoxylated bisphenol A dimethacrylate |
| | Ethoxylated or propoxylated bisphenol F di(meth)acrylate |
| | Ethoxylated or propoxylated bispheno S di(meth)acrylate |
| | 4,4'-dihydroxybiphenyl di(meth)acrylate |
| | Hydroquinone di(meth)acrylate |
| 3 | tri(meth)acrylates from the reaction of triglycidyl ethers of trihydric phenols and phenol or cresol novolaks containing three hydroxyl groups, with (meth)acrylic acid. |
| Other | Structures FI–FIV described in U.S. Pat. No. 6,100,007 |
| | Structures FI–FIII described in U.S. Pat. No. 6,413,697 |
| | Structures V–VII, Diacrylate II–III, Diacrylate IV (1-methylethylidene) bis[4,1-phenyleneoxy (2-hydroxy-3,1-propanediyl)] (Ebecryl 3700) described in U.S. Pat. No. 5,476,748 |
| | Structures CI–IX of US-A-2001/0046642 |

Preferably, the poly(meth)acrylate includes a tri(meth)acrylate or higher. Preferred compositions are those in which the free radically curable component contains a tri(meth)acrylate or a penta(meth)acrylate. Examples are the tri(meth)acrylates of hexane-2,4,6-triol, glycerol, 1,1,1-trimethylolpropane, ethoxylated or propoxylated glycerol, and ethoxylated or propoxylated 1,1,1-trimethylolpropane. Other examples are the hydroxyl-containing tri(meth)acrylates obtained by reacting triepoxide compounds (e.g., the triglycidyl ethers of the triols listed above) with (meth) acrylic acid. Other examples are pentaeryritol tetraacrylate, bistrimethylolpropane tetaacrylate, pentaerythritol monohydroxytri(meth)acrylate, or dipentaerythritol monohydroxypenta(meth)acrylate.

The poly(meth)acrylate may include polyfunctional urethane (meth)acrylates and their oligomers. Urethane (meth) acrylates can be prepared by, e.g., reacting a hydroxyl-terminated polyurethane with acrylic acid or methacrylic acid, or by reacting an isocyanate-terminated prepolymer with hydroxyalkyl (meth)acrylates to give the urethane (meth)acrylate. Urethane (meth)acrylates of this kind are known and some are commercially available, e.g., Ebecryl 265, Ebecryl 1290, Ebecryl 2001, Ebecryl 8302, and Ebecryl 8803 (UCB Radcure).

Examples of suitable aromatic tri(meth)acrylates are the reaction products of triglycidyl ethers of trihydric phenols and phenol or cresol novolaks contaning three hydroxyl groups, with (meth)acrylic acid.

The following are examples of commercial poly(meth) acrylates: SR® 295, SR® 350, SR® 351, SR® 367, SR® 368, SR® 399, SR®® 444, SR® 454, and SR® 9041 (SARTOMER Company) and #9656 (Monomer Polymer Dajac Laboratories).

SR® 368 is an example of an isocyanurate triacrylate, which is preferably included in the photocurable composition with a smaller amount of a monohydroxypentaacrylate such as SR® 399 to avoid producing tacky sidewalls in the 3-D object.

Preferred compositions are those in which the free radically curable component contains a tri(meth)acrylate or a penta(meth)acrylate.

Additional examples of commercially available acrylates include KAYARAD R-526, HDDA, NPGDA, TPGDA, MANDA, R-551, R-712, R-604, R-684, PET-30, GPO-303, TMPTA, THE-330, DPHA-21, DPHA-2C, DPHA-21, D-310, D-330, DPCA-20, DPCA-30, DPCA-60, DPCA-120, DN-0075, DN-2475, T-1420, T-2020, T-2040, TPA-320, TPA-330, RP-1040, R-011, R-300, R-205 (Nippon Kayaku Co., Ltd.), Aronix M-210, M-220, M-233, M-240, M-215, M-305, M-309, M-310, M-315, M-325, M400, M-6200, M-6400 (Toagosei Chemical Industry Co, Ltd.), Light acrylate BP4EA, BP-4PA, BP-2EA, BP-2PA, DCP-A (Kyoeisha Chemical Industry Co., Ltd.), New Frontier BPE-4, TEICA, BR-42M, GX-8345 (Daichi Kogyo Seiyaku Co., Lti), ASF-400 (Nippon Steel Chemical Co.), Ripoxy SP-1506, SP-1507, SP-1509, VR-77, SP-4010, SP-4060 (Showa Highpolymer Co., Ltd.), NK Ester A-BPE-4 and NK Ester A-DPH (Shin-Nakamura Chemical Industry Co., Ltd.), SA-1002 (Mitsubishi Chemical Co., Ltd.), Viscoat-195, Viscoat-230, Viscoat-260, Viscoat-310, Viscoat-214HP, Viscoat-295, Viscoat-300, Viscoat-360, Viscoat-GPT, Viscoat-400, Viscoat-700, Viscoat-540, Viscoat-3000, Viscoat-3700 (Osaka Organic Chemical Industry Co., Ltd.).

Preferably, the radically curable monomer includes a compound having at least one terminal and/or at least one pendant (i.e., internal) unsaturated group and at least one terminal and/or at least one pendant hydroxyl group. The composition may contain more than one such compound. Examples of such compounds include hydroxy mono(meth) acrylates, hydroxy poly(meth)acrylates, hydroxy monovinylethers, and hydroxy polyvinylethers. Commercially available examples include dipentyaerythritol pentaacrylate (SR® 399), pentaerythritol triacrylate (SR® 444), and bisphenol A diglycidyl ether diacrylate (Ebecryl 3700).

Alternatively, the poly(meth)acrylate may be, or include, poly(meth)acrylates prepared from reactive dendrimers (polyols) and a (meth)acrylate. This material is commercially available, e.g. CN 2302 (Sartomer Chemical Co.).

The photocurable composition preferably contains up to 60%, more preferably from 5 to 20%, even more preferably from 9 to 15% of radically curable monomer(s).

In one embodiment, the photocurable composition contains up to 40% by weight, more preferably from 5 to 20% by weight, of a cycloaliphatic or aromatic di(meth)acrylate and up to 15% by weight, preferably up to 10% by weight of a poly(meth)acrylate with 3 or more (meth)acrylate groups. The ratio of diacrylate to poly(meth)acrylate with 3 or more (meth)acrylate groups may vary, but preferably the latter is no more than 50% of total (meth)acrylates.

In another embodiment, the photocurable composition may contain much smaller relative amounts of di(meth) acrylate, and may even contain exclusively poly(meth)acrylates with 3 or more (meth)acrylate groups as radically curable monomer (b) with no or substantially no di(meth) acrylate.

The photocurable composition of the invention may include mixtures of the radically curable compounds described above.

C. Reactive Particles

The reactive particles have a core containing a crosslinked elastomeric core and a shell containing reactive groups. The core is preferably composed of polysiloxane, polybutadiene or other elastomeric material.

The reactive particles may be made by the method disclosed in U.S. Pat. No. 4,853,434 to Block, incorporated in its entirety herein by reference. Block discloses reactive particles that are useful in producing fiber-reinforced plastics, structural adhesives, laminated plastics, and annealing lacquers.

The core is a preferentially crosslinked polyorganosiloxane rubber that may include dialkylsiloxane repeating units, where "alkyl" is C1-C6 alkyl. The core preferably includes dimethylsiloxane repeating units.

The reactive groups preferably include epoxy groups, oxetane groups, ethylenically unsaturated groups, and/or hydroxy groups. For example, the reactive groups may include oxirane, glycidyl, vinyl ester, vinyl ether, or acrylate groups, or combinations thereof.

The reactive particles react with the polymer matrix that forms when the photocurable composition is polymerized by forming one or more chemical bonds to the polymer matrix via the reactive groups. Preferably, the reactive groups react substantially completely on curing the photocurable composition.

The amount of reactive particles in the photocurable composition may be varied as needed depending on the particular components (a) and (b) in a given photocurable composition. At high concentrations of reactive particles the photocurable composition may become too viscous and bubble formation may be a problem. Defoamers have been used to overcome bubble formation including DF-100 (Hanse-Chemie), SAG 1000 (OSI Specialities, Inc), FS-1265 (DOW Corning), Lodyne S100 (Source), and Surfynol DF-37 (Air Products and Chemicals). Preferably the photocurable composition contains from 1 to 50% by weight of the reactive particles, more preferably from 1 to 15% by weight, most preferred from 1 to 5%.

The reactive particles preferably have an average particle diameter of 0.01 to 50 μm more preferably 0.1 to 5 μm.

Preferred reactive particles that are available commercially are Albidur EP 2240, Albidur EP 2640, Albidur VE 3320, Albidur EP 5340, Albidur EP 5640, and Albiflex 296 (Hanse Chemie, Germany). Other core/shell materials that may be used are listed in the following Table 2; in the table, the cores are listed in the left column and the shells in the right column. Although, specific examples of core/shell compositions have been given, the skilled person will appreciate that different cores can be used with different shells.

TABLE 2

| Core | Shell |
|---|---|
| polybutadiene | poly(styrene-co-acrylonitrile) |
| polybutadiene | poly(acrylonitrile) |
| polybutadiene-co-styrene | poly(carboxy-functionalized PMMA-co-styrene) |
| amine terminated polybutadiene | polystyrene-co-butyl acrylate |
| methacrylated polybutadiene | polystyrene |
| methacrylated polybutadiene | poly(methylmethacrylate-co-maleic anhydride) |
| alkyl acrylates or polyorganosiloxane rubber | poly(alkyl methacrylate) or poly(styrene-co-acrylonitrile) |
| rubber | polystyrene (PS) |
| rubber | poly(methylmethacrylate-co-styrene) (PMMA-PS) |
| rubber | poly(styrene-co-acrylonitrile) (PSAN) |
| rubber | modified vinyl esters |
| rubber | epoxies |
| elastomers | PMMA or polystyrene |
| poly(ethylene glycol) modified urethane acrylate | PMMA |
| polyurethane acrylate | PMMA |
| polyurethane acrylate | polyglycidylmethacrylate-co-acrylonitrile |
| polycarbonate | poly(styrene-co-acrylonitrile) |
| polycarbonate | poly(cyclohexanedimethanol terephthalate) |
| PTFE | thermoplastic resin such as polycarbonate |
| Miscellaneous shells | |
| | poly(methylmethacrylate-co-glycidyl methacrylate) |
| | poly(methylmethacrylate-co-acrylonitrile-co-divinyl benzene) |

The core shell reactive particles can include more than one core and/or more than one shell so long as the outer shell contains reactive groups. For example, the following combination of core/shells may be used:

poly(divinyl benzene)/polybutylacrylate/poly(methyl methacrylate) (PDVB/PBA/PMMA)

PMMA/PBA/PMMA coethylacrylate-co-glycidyl methacrylate and poly(styrene-co-acrylonitrile)/PMMA/acrylate rubber of PMMA Other materials that can be used to make the core/shell particles for use in the present invention can be found in:
1. Vazquez, Flavio; Cartier, Herve; Landfester, Katharina; Hu, Guo-Hua; Pith, Tha; Lambla, Morand: Polymers for Advanced Technologies v 6, 5 May 1995, p 309-315 1995, which discloses core/shell materials with epoxy groups on the surface of the shell. The core is made from polystyrene with a shell of poly(methyl methyacrylate-co-maleic anhydride) that has been functionalized with glycidyl methacrylate.
2. Nakamura, Yoshinobu; Suzuki, Hideto; Iko, Kazuo; Okubo, Masayoshi; Matsumoto, Tsunetaka; Tabata, Haruo, J Appl Polym Sci v 33 n 3 Feb. 20, 1987 p 885-897, 1987, which discloses a core/shell material with a poly(butyl acrylate) core and poly(methyl methacrylate) shell. The shell has been treated so that it contains epoxide groups.
3. Saija, L. M.; Uminski, M., Surface Coatings International Part B 2002 85, No. B2, June 2002, p. 149-53, which describes a core shell material with core and shell prepared from poly(methyl methacrylate-co-butyl acrylate), and treated with MMA or AMPS to produce material with carboxylic acid groups on the surface.
4. Martinez, I. M.; Molina, A. M.; Gonzalea, F. G.; Forcada, J., Journal of Polymer Science: Polymer Chemistry Edition 2001 39, No. 17, 1 Sep. 2001, p. 2929-36, which describes a surface functionalized core-shell material. The core is prepared from polystyrene and poly(styrene-co-methyl methacrylate). The shell is prepared with polyacrylates containing amine.
5. Aerdts, A. M.; Groeninckx, G.; Zirkzee, H. F.; van Aert, H. A. M; Geurts, J. M., Polymer 1997 38, No. 16, 1997, p. 4247-52, which describes a material using polystyrene, poly(methyl methacrylate) or polybutadiene as its core. An epoxidized poly(methyl methacrylate) is used for the shell. The epoxide sites are reactive sites on the core of this material.
6. Kim, J. W.; Kim, J. Y.; Suh, K. D., J. Appl. Polym. Sci. 1997 63, No. 12, 21Mar. 1997, p. 1589-600. This article discloses a core/shell with a polyurethane core with epoxy groups on the surface of a shell prepared from poly (glycidyl methacrylate-co-acrylonitile).

The next five patent examples are all core/shells without a reactive group at the surface of the molecule and cannot be used as reactive in the present invention but are given as examples of core materials that can be used in the core/shell particles of the present invention:
1. U.S. Pat. No. 5,773,520, which discloses core/shell materials that impart impact resistance to thermoplastic polymers. Various elastomer core materials are disclosed based on aliphatic acrylates that can also be used to form the core in the reactive particles of the present invention.
2. U.S. Pat. No. 6,203,973, which discloses polymer latexes with a shell/core morphology for use in silver photographic emulsions; the core materials are applicable in the present invention.
3. U.S. Pat. No. 6,512,027 describes a polyester resin having a high heat shock resistance and including core/shell fillers; the core materials include silicon-based, diene-based or acrylic based elastomers; the shells are vinyl-based vitreous resins. The core materials are applicable in the present invention.
4. U.S. Pat. No. 6,180,693 describes core/shell particles for incorporation into epoxy resins to improve their processing and impact strength; the specification discloses a wide list of core polymers based on unsaturated monomers; shells are derived from vinyl monomers; the core materials are applicable in the present invention.
5. U.S. Pat. No. 5,276,092 describes core/shell additives for modifying the processing and impact strength of polyvinyl chloride and other thermoplastics. The cores are made of rubbery materials and the outer shells are made of hard polymers; the core materials are applicable in the present invention.

Preferably, the reactive particles are added to the photocurable composition as a mixture of the reactive particles and a reactive liquid medium containing, e.g. epoxy or ethylenically unsaturated groups. For example, in Aibidur EP 2240, the reactive organosiloxane particles are dispersed in bisphenol A glycidyl ether, in bisphenol A vinyl ester for Albidur VE 3320, and in cycloaliphatic epoxide for Albidur EP 5340.

Commercial dispersions of reactive particles may be heated at from 50 to 60° C. to reduce viscosity, preferably without string. Stiring while heating may cause instability in the reactive particles. The commercially available reactive particle dispersions are preferably used within the manufacturer's listed shelf life; otherwise the solids may coagulate and settle out of solution over time.

Compatibility of the reactive particles and the commercially available dispersions thereof with components (a) and (b) will vary depending on their relative polarities. This must be taken into account in preparing formulations that are suitable for stereolithography.

D. Photoinitiators

Radical photoinitiator (d) may be chosen from those commonly used to initiate radical photopolymerization. Examples of radical photoinitiators include benzoins, e.g., benzoin, benzoin ethers such as benzoin methyl ether, benzoin ethyl ether, benzoin isopropyl ether, benzoin phenyl ether, and benzoin acetate; acetophenones, e.g., acetophenone, 2,2-dimethoxyacetophenone, and 1,1-dichloroacetophenone; benzil ketals, e.g., benzil dimethylketal and benzil diethyl ketal; anthraquinones, e.g., 2-methylanthraquinone, 2-ethylanthraquinone, 2-tert-butylanthraquinone, 1-chloroanthraquinone and 2-amylanthraquinone; triphenylphosphine; benzoylphosphine oxides, e.g., 2,4,6-trimethylbenzoyl-diphenylphosphine oxide (Luzirin® TPO); bisacylphosphine oxides; benzophenones, e.g., benzophenone and 4,4'-bis(NN'-di-methyl-amino)benzophenone; thioxanthones and xanthones; acridine derivatives; phenazine derivatives; quinoxaline derivatives; 1-phenyl-1,2-propanedione 2-O-benzoyl oxime; 4-(2-hydroxyethoxy)Phenyl-(2-propyl)ketone (Irgacure 2959; Ciba Specialty Chemicals); 1-aminophenyl ketones or 1-hydroxy phenyl ketones, e.g., 1-hydroxycyclohexyl phenyl ketone, 2-hydroxyisopropyl phenyl ketone, phenyl 1-hydroxyisopropyl ketone, and 4-isopropylphenyl 1-hydroxyisopropyl ketone.

Preferably, the photocurable composition includes a 1-hydroxy phenyl ketone, more preferably 1-hydroxycyclohexyl phenyl ketone, e.g., Irgacure 184 (Ciba Specialty Chemicals).

The radical photoinitiator is preferably present at from 0.1 to 10% by weight, more preferably from 0.3 to 8% by weight, most preferably from 0.4 to 7% by weight of the photocurable composition.

Cationic photoinitiators (e) may be chosen from those commonly used to initiate cationic photopolymerization. Examples include onium salts with anions of weak nucleophilicity, e.g., halonium salts, iodosyl salts, sulfonium salts, sulfoxonium salts, or diazonium salts. Suitable anions include hexafluoro antimonate and hexafluoro phosphate. Metallocene salts are also suitable as photoinitiators. Onium salt and metallocene salt photoinitiators are described in U.S. Pat. No. 3,708,296; "UV-Curing, Science and Technology", (Editor: S. P. Pappas, Technology Marketing Corp., Stamford, Conn.); and "Chemistry & Technology of UV & EB Formulations for Coatings, Inks & Paints," Vol. 3 (edited by P. K. T. Oldring), each of which is incorporated herein by reference.

Examples of commercial cationic photoinitiators include UVI-6974, UVI-6976, UVI-6970, UVI-6960, UVI-6990 (manufactured by DOW Corp.), CD-1010, CD-1011, CD-1012 (manufactured by Sartomer Corp.), Adekaoptomer SP-150, SP-151, SP-170, SP-171 (manufactured by Asahi Denka Kogyo Co., Ltd.), Irgacure 261 (Ciba Specialty Chemicals Corp.), CI-2481, CI-2624, CI-2639, CI-2064 (Nippon Soda Co, Ltd.), DTS-102, DTS-103, NAT-103, NDS-103, TPS-103, MDS-103, MPI-103, BBI-103 (Midori Chemical Co, Ltd.). Most preferred are UVI-6974, CD-1010, UVI-6976, Adekaoptomer SP-170, SP-171, CD-1012, and MPI-103. The cationic photoinitiators can be used either individually or in combination of two or more. The cationic photoinitiator is preferably present at from 0.05 to 12% by weight, more preferably from 0.1 to 11% by weight, most preferably from 0.15 to 10% by weight of the photocurable composition.

For stereolithography using a laser, the radical and cationic photoinitiators are preferably selected and their concentrations are preferably adjusted to achieve an absorption capacity such that the depth of cure at the normal laser rate is from about 0.1 to about 2.5 mm.

E. Other Components

The photocurable composition may contain a variety of other components. Examples of such components include modifiers, tougheners, stabilizers, antifoaming agents, dispersants, leveling agents, thickening agents, water, flame retardants, antioxidants, pigments, dyes, fillers, anti-settling agents, and combinations thereof. These additives are commercially available and include FS-1265 (Dow Corning), Surfynol DF-37 (Air Products and Chemicals, Inc.), Albidur DF 100 (Hanse-Chemie), Dysperbyk 107, Dysperbyk 111, Dysperbyk 130, and Dysperbyk 180 (Byk-Chemie), Lodyne S100 (Daikin), EFKA 3883, EFKA 6220 and EFKA 6906 (EFKA Additives), N102, Black XV, ODB-2, and ODB-7, (ESCO Co), Tint-AYD NV 7317, Tint-AYD PC 9317, Tint-AYD PC 9393 (Elementis Specialties), Graphitan 7525 (Ciba Specialty Chemicals) and Silica T720, Mogul E and Black Pearls E (Cabot Corporation).

The photocurable composition may contain one or more polytetramethylene ether glycols ("poly THF"). The poly THF preferably has molecular weight from about 250 to 2500. The poly THF may be terminated with hydroxy, epoxy, or ethylenically unsaturated group(s). Polytetramethylene ether glycols are commercially available in the Polymeg® line (Penn Specialty Chemicals). Preferably, the photocurable composition includes Polymeg® 1000 or Polymeg® 2000.

The photocurable composition may also contain monofunctional alcohols, diols, polyols or combinations thereof. Examples of suitable hydroxyl functional components include Acryflow P120 (Lyondell Chemical Company), Arcol LG 650 (Bayer), benzyl alcohol (Aldrich), CAPA 2085, CAPA 2205, CPA 3050, CAPA 4101, CAPA 7201A (Solvay Corp.), Dianol 320, Dianol 340 (Seppic Corp.), Gelest DBE-C25 (Genesee Polymers Corporation), Lexorez 1405-65, Lexorez 4505-52, Lexorez 5901-300 (Inolex Chemical Co.), Ravecarb 102, Ravecarb 106 (EniChem), and piperonyl alcohol (Aldrich). The photocurable composition may also contain one or more diols such as 1,4-cyclohexanedimethanol ("CHDM").

The photocurable composition may also contain one or more stabilizers. Preferred stabilizers are hindered amines, e.g., benzyl dimethyl amine ("BDMA").

Light stabilizes may be used to improve build quality of the models. Not to be held to theory, it has been observed that these components have proven affective in reducing gel build-up on sidewalls. The light stabilizers reduce the sensitivity of the formulation and the polymerization process is confined to the areas intended to be imaged, without concern for stray light These light stabilizers are commercially available and can include Alkanox 240, Alkanox P-24, Alkanox TNPP (Great Lake Chemicals Corporation), BHT, hydroquinone, pyrene (Aldrich), Irganox 1035, Tinuvin 144 and Tinuvin 900 (Ciba Specialty Chemicals).

F. Stereolithography Equipment

The actinic radiation is generally a beam of light that is controlled by a computer. Preferably, the beam is a laser beam controlled by a mirror.

In principle any stereolithography machine may be used to carry out the inventive method. Stereolithography equipment is commercially available from various manufacturers. Table 3 lists commercial SL equipment available from 3D Systems, Inc. (Valencia, Calif.).

TABLE 3

Stereolithography Machines

| Machine | Wavelength (nm) |
|---|---|
| SLA 250 | 325 |
| SLA 2500 (Viper) | 355 |
| SLA 3500 | 355 |
| SLA 500 | 351 |
| SLA 5000 | 355 |
| SLA 7000 | 355 |

"Green model" is the 3-D object initially formed by the stereolithography process of layering and curing, where typically the layers are not completely cured. This permits successive layers to better adhere by bonding together when further cured.

"Postcuring" is the process of reacting a green model to further cure the partially cured layers. A green model may be postcured by exposure to heat, actinic radiation, or both.

"Green strength" is a general term for mechanical performance properties of a green model, including modulus, strain, strength, hardness, and layer-to-layer adhesion. For example, green strength may be reported by measuring flexural modulus (ASTM D 790). An object having low green strength may deform under its own weight, or may sag or collapse during curing.

"Penetration depth" ("$D_p$") is a property of a given pairing of photocurable composition and laser. $D_p$ is the slope of a plot ("working curve") of cure depth (mm) against the log of exposure (mJ/cm$^2$). "Cure depth" is the measured thickness of a layer formed by exposing the photocurable composition to a specified dose of energy from the laser.

"Critical Exposure" ("$E_c$") is a property of a photocurable composition and expresses the threshold amount of radiation in mJ/cm$^2$ that causes the photocurable composition to gel. The $E_c$ is the maximum exposure value of the working curve when cure depth is still zero.

"Dispersed" means a separate phase, e.g., of particles distributed by mixing in a photocurable composition.

Instead of building up a 3D object by applying the composition of the present invention by means of stereolithography, the composition could be applied by jetting.

3D objects produced according to the present invention can be made that have good physical properties and smooth, glossy surfaces. The following values may be achievable:

| | |
|---|---|
| Flexural modulus (green, at 10 minutes): | 100–150 MPa |
| Flexural modulus (green, at 60 minutes): | 250–350 MPa |

-continued

| | |
|---|---|
| Flexural modulus (at full cure): | 2000–3000 MPa |
| Tensile modulus: | 2000–3000 MPa |
| Tensile strength: | 42–62 MPa |
| Elongation at break: | 6–15% |
| Impact strength: | 0.5–0.8 ft-lbs/in (27–43 J/cm) |

A further advantage of the reactive particles of the present invention is that they have a reduced liability to sediment out as compared to inert fillers commonly used in the field of stereolithography and jetting and so form well-homogenised baths and reservoirs, which reduces the need to agitate the baths and reservoirs and so makes them easier to use.

While the description hitherto has concentrated on the application of the compositions of the present invention to form 3D objects, there are other potential applications, which include:

1. Adhesives, including two-part, pressure sensitive, and UV-curable adhesives.
2. Photoimageable coatings, including electronic applications such as photoresists. This can include primary image resists, solder masks, and photoimageable dielectrics for microvia or sequential build up processes.
3. Coatings for optical fibers.
4. 3D processes other than stereolithography, such as 3D printing or jetting, especially where smooth finishes are desired.
5. Paints where high gloss is desired, e.g. for the auto industry.
6. Powder coatings, especially for opaque coatings with improved gloss.
7. Forming masks for applying solder to selected areas of a substrate, e.g. a printed circuit board.
8. Forming masks through which photoresists are exposed.

G. EXAMPLES

The general procedure used for preparing 3-D objects with SL equipment is as follows. The photocurable composition was placed in a 300-700 ml plastic container or in a vat designed for use with the stereolithography machines. The specific container depends on the size of the desired 3-D object. The photocurable composition was poured into the container within the machine at about 30° C. The surface of the composition, in its entirety or a predetermined pattern, was irradiated with a UV/VIS light source so that a layer of a desired thickness cured and solidified in the irradiated area A new layer of the photocurable composition was formed on the solidified layer. The new layer was likewise irradiated over the entire surface or in a predetermined pattern. The newly solidified layer adhered to the underlying solidified layer. Repeating the layer formation step and the irradiation step produced a green model of multiple solidified layers.

The green model was then rinsed in tripropylene glycol monomethyl ether ("TPM"). The green model was then rinsed with water and dried with compressed air. The dried green model was then postcured with UV radiation in a postcure apparatus ("PCA") for about 60-90 minutes.

Stereolithography equipment typically allows for setting various operational parameters. Examples thereof appear in Tables 4 and 5 below. The parameters are well known to a person of skill in the art of stereolithography and may be adjusted as needed depending on various factors, including the specific photocurable composition and the geometry of the desired 3-D object.

"Layer Thickness" is the thickness of each slice or layer of the 3-dimensional object that is to be built.

"Hatch Overcure" is the depth beyond the layer thickness which is exposed during a given pass (hatch) of the laser.

"Hatch Spacing" is the distance between adjacent hatch vectors.

"Fill Cure Depth" is the absolute depth of curing for the fill vectors on a given pass of fill. Fills are tightly spaced vectors drawn on the regions of the part that form upfacing or downfacing surfaces.

"Fill Spacing" is the distance between adjacent fill vectors.

"Border Overcure" is the depth beyond the layer thickness that the borders are cured.

"Preferred Blade Gap" is a distance, given in percent of layer thickness, describing the preferred distance between the bottom of the recoater and last layer of the part at time of sweeping.

TABLE 4

| Parameter | Value |
|---|---|
| Layer thickness | 0.004 inch (0.1 mm) |
| Hatch Overcure | 0.000 inch (0 mm) |
| Hatch Spacing | 0.004 inch (0.1 mm) |
| Fill Cure Depth | 0.010 inch (0.25 mm) |
| Fill Spacing | 0.004 inch (0.1 mm) |
| Border Overcure | 0.009 inch (0.23 mm) |
| Preferred Blade Gap | 0.004 inch (0.1 mm) |
| $D_p$ | 0.0063 inch (0.16 mm) |
| $E_c$ | 9.2 mJ/cm$^2$ |

TABLE 5

| Parameter | Value |
|---|---|
| Layer thickness | 0.006 inch (0.15 mm) |
| Hatch Overcure | 0.002 inch (0.05 mm) |
| Hatch Spacing | 0.009 inch (0.22 mm) |
| Fill Cure Depth | 0.015 inch (0.38 mm) |
| Fill Spacing | |
| Border Overcure | 0.012 inch (0.30 mm) |
| Preferred Blade Gap | 0.004 inch (0.10 mm) |
| Dp (Depth of Penetration) | 0.0057 inch (0.14 mm) |
| Ec (Critical Energy) | 6.3 mJ/cm$^2$ |

Example 1

The components shown in Table 6 were mixed at room temperature in a container to form a homogeneous photocurable composition. The composition was an opaque liquid with a viscosity of 195 CPS at 30° C. (Brookfield, RVT).

Examples 2-5

The resin formulations shown in Table 6 were prepared using the procedure described for Example 1 (the numbers in Table 6 refer to the percent by weight for each component of the total mixture). Table 7 provides definitions for the trade names in Table 6.

TABLE 6

| Component | Ex. 1 | Ex. 2 | Ex. 3 | Ex. 4 | Ex. 5 |
|---|---|---|---|---|---|
| Uvacure 1500 | 49 | 45.18 | 39.42 | 33.95 | |
| Heloxy 48 | 8 | 27 | 28.84 | 15.52 | |
| Heloxy 84 | | | | 7.76 | 10 |
| Heloxy 107 | 8 | | | 12.80 | 15.1 |
| Gelest DBE-C25 | | | 3.85 | | |
| Albidur EP 2240 | 3 | | | | |
| Albidur VE 3320 | | | | 3 | |
| Albidur EP 5340 | | 10 | 1.92 | | 40 |
| Dianol 320 | | | | 7.76 | 15 |
| Polymeg 1000 | 6 | | | | |
| Polymeg 2000 | | | 7.69 | | |
| CHDM | 6 | | | | |
| SR 368 | 10 | | | | |
| SR 399 | 3 | 5.4 | 5.77 | 5.82 | |
| SR 9041 | | | | | 6.1 |
| Ebecryl 3700 | | 5.67 | 5.77 | 6.11 | |
| CN 120 | | | | | 6.3 |
| Vectomer 4010 | | | 1.92 | | |
| Irgacure 184 | 2 | 2.25 | 1.92 | 1.94 | 2.5 |
| UVI 6976 | 5 | 4.5 | 2.88 | 5.33 | 5 |
| BDMA | 0.01 | 0.01 | 0.01 | 0.010 | 0.01 |
| BHT | | | | | |
| Total | 100.0 | 100.01 | 99.99 | 100.0 | 100.01 |

TABLE 7

Definitions for Trade Names

| Trade Name | Source | Chemical Name |
|---|---|---|
| UVACURE 1500 | UCB Chemicals Corp. (Radcure) | 3,4-Epoxycyclohexylmethyl 3',4'-epoxycyclohexanecarboxylate |
| HELOXY 48 | Resolution Performance Products LLC | Trimethylolpropane triglycidyl ether |
| HELOXY 84 | Resolution Performance Products LLC | Triglycidyl ether of polypropoxylated glycerol |
| HELOXY 107 | Resolution Performance Products LLC | Diglycidyl ether of CHDM |
| Gelest DBE-C25 | Genesee Polymers Corporation | Poly(dimethylsiloxane), hydroxy(polyethyleneoxy)-propylether terminated |
| Albidur EP 2240 | Hanse Chemie | Silicone-epoxy particles in Bisphenol A epoxy resin |

TABLE 7-continued

Definitions for Trade Names

| Trade Name | Source | Chemical Name |
|---|---|---|
| Albidur VE 3320 | Hanse Chemie | Silicone-vinyl ester particles in vinyl ester resin and styrene |
| Albidur EP 5340 | Hanse Chemie | Silicone-epoxy particles in alicyclic epoxy resin |
| Polymeg 1000 | Penn Specialty Chemicals | Polytetramethylene ether glycol (MW ca. 1000) |
| Polymeg 2000 | Penn Specialty Chemicals | Polytetramethylene ether glycol (MW ca. 2000) |
| CHDM 99% | Aldrich Chemical Co. | 1,4-Cyclohexanedimethanol |
| Dianol 320 | Seppic, Inc. | Dipropoxylated bisphenol A |
| SR 368 | Sartomer Co. | Tris(2-hydroxy ethyl) isocyanurate triacrylate |
| SR 399 | Sartomer Co. | Dipentaerythritol pentaacrylate |
| SR 9041 | Sartomer Co. | Pentaacrylate ester |
| CN 120 | Sartomer Co. | Bisphenol A Epoxy Diacrylate |
| Ebecryl 3700 | Radcure Specialties | Bisphenol A diglycidyl ether diacrylate [4687-94-9] |
| Vectomer 4010 | Morflex, Inc. | Bis[4-(vinyloxy)butyl] isophthalate, 98% |
| Irgacure 184 | Ciba Specialty Chemicals | 1-hydroxycyclohexyl phenyl ketone |
| Cyracure UVI 6976 | Dow Chemical Company | Mixture of PhS—$(C_6H_4)$—$S^+Ph_2SbF_6^-$ and $Ph_2S^+$—$(C_6H_4)S(C_6H_4)$—$S^+Ph_2(SbF_6^-)_2$ |

Example 6

A 3D Systems Viper Si2 (SLA 2500) machine was used to prepare 10 objects using the formulation of Example 1. The machine settings used are those in Table 4. The objects were opaque white or off-white and had a glossy surface.

Example 7

An SLA 5000 machine was used to prepare 24 objects using the formulation of Example 1. The machine settings used are those in Table 5. The objects were opaque white or off-white and had a glossy surface.

Example 8

Gloss is a term used to describe the relative amount and nature of mirror like (specular) reflection. Numerical value for the amount of specular reflection relative to that of a standard surface under the same geometric conditions. The gloss of several samples of some typical stereolithography resins was measured with a Byk-Gardner GB 4520 micro Tri-gloss meter. Some of the resins contained reactive core/shell particles according to the present invention, as indicated in Table 8, and some did not. The industry standard measuring angle of 60° was used and the results are set out in the Table 8 below. In Table 8, each number is the average of at least 30 readings.

TABLE 8

| Resin | Gloss Value at 60° | Does resin include reactive particles? |
|---|---|---|
| SL7565 | 90.5 | No |
| SL5440 | 92.4 | No |
| SL5530 | 74.7 | No |
| SL7560 containing an addition of Albidur EP 2240 at 3% concentration | 103.7 | Yes |

Example 9

This example shows the incorporation of two commercially available reactive core/shell materials into materials for forming soldermasks, i.e. masking materials that prevent the deposition of solder onto a substrate.

Probimer® 77 FSP soldermask, which is commercially available from Vantico Inc, Los Angeles, Calif., was used as the base for these tests. It is a photopolymerisable composition that is a mixture of acrylate and epoxy monomers and resins. The acrylated compounds are crosslinked during an imaging step, in which the layer of soldermask is exposed to radiation in a pattern corresponding to areas where solder is not wanted. After removing the portions that were not imaged, the coating is heated and the epoxy resins are thermally cured. The epoxy cure gives the coating the thermal and chemical resistance required to go through the processes used to prepare circuit boards.

The two core/shell compositions containing reactive shell groups that were used in the tests were Albidur EP 2240 and Albidur VE 3320, which are commercially available from Hanse Chemie USA, Inc, of Hilton Head, S.C. Albidur EP 2240, contains reactive organosiloxane particles with reactive shell groups dispersed in bisphenol A glycidyl ether; Albidur VE 3320 is the same except that the organosiloxanle particles are dispersed in bisphenol A vinyl ester.

In a first series of test compositions, Albidur EP 2240 in varying amounts was mixed into 89 g of Probimer®77 1040 (Resin) under high sheer mixing with a Cowles blade at 1000 rpm for 30 min to form a resin component. The amounts of Albidur EP 2240 additions were 2%, 4% and 10% based on the weight of the Probimer®77. In the same way, 2% by weight (0.4 g) of Albidur EP 2240 was mixed into 20 g of Hardener 77 1050 to form a hardener component. The resin/hardener components were then hand mixed for 10-15 minutes to form a soldermask composition.

In a second series of test compositions, the above procedures were followed except that Albidur VE 3320 was used in place of Albidur EP 2240.

Probimer® 77 FSP soldermask with no additions was used as a control.

Test panels were cleaned in an IS pumice scrubber with a pumice concentration of 15%, rinsed with water and dried in an oven for 15 minutes at 85° C. The soldermask composition was applied to test panels by screen printing on a hand screen table under the following conditions:

| | |
|---|---|
| Printing Technique: | Flood/Print/Print |
| Mesh Size: | 102 |
| Thread Characteristics: | 100 micro wide/Plain Weave |
| Mesh Tension | 18–20 Newtons |
| Mesh Angle: | 20–22° |
| Squeegee Hardness: | 70 durometer (Serilor Blade) |

All three Albidur VE 3320VE samples showed good flow and coverage. The Albidur EP 2240 samples at 2% and 4% exhibited acceptable flow levels. The test sample with the 10% addition of Albidur EP 2240 in the resin left a non-uniform surface appearance that did not level to a smooth surface appearance in the expected hold time of 15-minutes.

The printed panels were then tack dried at a temperature of 80° C. for 35 minutes in a laboratory Grieve batch oven. All samples had a tack-free surface after this initial baking cycle. The dried panels were then exposed to radiation from a SMX-7000 (Iron Doped) lamp under the following conditions:

| | |
|---|---|
| Exposure Energy: | 350 mJ/cm² |
| | Dosage for Final Schweizer Test Panels |
| Vacuum Pressure: | 62 cm Hg |
| Frame Temperature: | 18.3–20.3° C. |
| Artwork Type: | Diazo (Schweizer Test Panels) |
| Radiometer Type: | IL 1400A (International Light) |
| Probe Type: | XRL 140B |

As part of the exposure procedure, the test compositions were tested by exposing them through a 21-Step Stouffer step wedge, which has a series of gray scale steps that can be placed between the radiation source and the photocured composition to determine the exposure time for the material. The results are shown in Table 9:

TABLE 9

Stouffer Step (SSG) 21 results as compared to standard PR77 1040/1050.

| FSP Material | % Albidur Addition | SSG 21 @ 250 mJ | SSG 21 @ 350 mJ |
|---|---|---|---|
| PR77 1040/1050 | none | 8 | 9 |
| PR77 + EP 2240 | 2% | 9 | 10 |
| PR77 + EP 2240 | 4% | 9 | 11 |
| PR77 + EP 2240 | 10% | 11 | 12 |
| PR77 + VE 3340 | 2% | 9 | 10 |
| PR77 + VE 3340 | 4% | 9 | 10 |
| PR77 + VE 3340 | 10% | 9 | 11 |

It can be seen from the SSG values in Table 9 that increased levels of cure are achieved under identical processing conditions with all samples that contain Albidur core/shell particles as compared to the control which do not.

An "SSR gauge" is a commercially available phototool that has a triangular feature with decreasing exposed and unexposed line features that range from 20 mils down to below 1.0 mil. The best resolution results are those at or below the 1.0 mil thickness mark. The SSR phototool is placed on the tack dried soldermask test film during the UV exposure process. The results are then measured following the development process through a 1% carbonate solution. The results are given in Table 10.

TABLE 10

Stouffer Step Resolution (SSR) results as compared to standard PR77 1040/1050.

| FSP Material | % Albidur Addition | SSR @ 250 mJ | SSR @ 350 mJ |
|---|---|---|---|
| PR77 1040/1050 | none | <1.0 | <2.0 |
| PR77 + EP 2240 | 2% | <1.0 | <2.0 |
| PR77 + EP 2240 | 10% | <2.0 | <2.5 |
| PR77 + VE 3340 | 2% | <1.0 | <2.0 |
| PR77 + VE 3340 | 10% | <1.5 | <2.0 |

The increased SSR results for the Albidur EP 2240 material showed that the material lowered the solubility properties of the base control material. Only the extreme ranges, 2% and 10% were evaluated for this property due to the fact that differences can only be measured appropriately with significant process or formula changes.

Development processing removes the non-crosslinked areas from the soldermask film, revealing the image specified by the artwork phototool. The following are the conditions run for these series of Albidur samples, which fall within standard operating processes for the Probimer.

Development Conditions: VCM II

| | |
|---|---|
| Temperature: | 86.8–89.3° F. (30.4–31.8° C.) |
| pH: | 10.8 |
| Carbonate Concentration: | 1.02% (Potassium Carbonate) |
| Development Dwell Time Range: | 75 seconds (Conveyor Speed: 5.2 ft/min (1.5 m/min)) |
| | 90 seconds (Conveyor Speed: 4.3 ft/min (1.3 m/min)) |
| Developer Pressure: | 46–52 psi (317–358 kPa) |
| Rinse Pressure: | 22–25 psi (152–172 kPa) |

Satisfactory processing results were achieved. The copper test surfaces exhibited no "scumming" or residue effects for any of the test samples.

The final thermal curing of the acrylated/epoxy system provides the extended crosslinking density required for the soldermask to develop insulation and chemical resistance properties during post-processing tests (e.g. soldering) and applications for the electronic circuit boards. The thermal cure took place in a Lab Grieve Batch Oven under the following conditions.

| | |
|---|---|
| Temperature: | 302° F. (150° C.) |
| Duration: | 60 minutes |

Hardness Testing

The cured panels were tested by trying to mark them with pencils of various hardnesses. All the panels withstood the 9H pencil, which is the highest accepted standard and no decrease in surface hardness was observed in the Albidur-containing samples as compared to the control that contained no Albidur.

Cross Hatch Testing:

The cured panels were tested by cutting into the mask with a crosshatch tool for a length of 1 inch (2.5 cm) followed by a second cut in the same area after a 90° rotation. The area is brushed clean of material and adhesive tape tested is applied to the area and then removed and the removal of mask was scored on a scale of 0-4 (the highest rating is 0).

| Test Method: Cross-Hatch Results | % Albidur Concentration | Result |
| --- | --- | --- |
| PR77 1040/1050 | 0 | 0–1 |
| PR77 + EP 2240 | 2% | 0–1 |
| PR77 + EP 2240 | 10% | 0–1 |
| PR77 + VE 3340 | 2% | 0–1 |
| PR77 + VE 3340 | 10% | 0–1 |

All Albidur-containing samples performed equally to the level of the control and no decrease in surface hardness was observed as compared to the control that contained no Albidur.

Solder Test Conditions

The samples and the control panels were dipped in solder under the following conditions:

| | |
| --- | --- |
| Solder Temperature: | 490–500° F. (254–260° C.) |
| Solder Flux: | Alpha Metals NR3108 VOC-Free/No Clean Flux |
| Solder Dip Time: | 5 seconds |
| Post-Cleaning: | Air Cool (1-minute), RT Water Rinse |

All the Albidur-containing samples withstood the above conditions

While embodiments of the invention have been described above, those embodiments illustrate but do not limit the invention. Adaptations and variations of those embodiments are within the scope of the invention as set forth in the following claims.

The invention claimed is:

1. A photocurable composition comprising:
   (a) at least one photocurable monomer;
   (b) reactive particles comprising a crosslinked elastomeric core and a shell of reactive groups on an outer surface of the crosslinked elastomeric core wherein the crosslinked elastomeric core comprises a crosslinked polysiloxane material and wherein the reactive groups are epoxy groups, ethylenically unsaturated groups or hydroxy groups; and
   (c) at least one photoinitiator for polymerization of the photocurable monomer.

2. The photocurable composition of claim 1 wherein the photocurable monomer comprises a cationically curable monomer and the photoinitiator comprises a cationic photoinitiator.

3. The photocurable composition of claim 2 wherein the cationically curable monomer comprises a polyepoxide.

4. The photocurable composition of claim 3 wherein the polyepoxide is an alicyclic polyepoxide having a monomer purity of greater than about 94%.

5. The photocurable composition of claim 1 wherein the photocurable monomer comprises a radically curable monomer and the photoinitiator comprises a radical photoinitiator.

6. The photocurable composition of claim 5 wherein the radically curable monomer comprises a poly(meth)acrylate.

7. The photocurable composition of claim 6 wherein the poly(meth)acrylate is selected from (he group consisting of a poly(meth)acrylate having at least one hydroxy group, a mono(meth)acrylate, a di(meth)acrylate and a poly(meth)acrylate containing at least three (meth)acrylate groups.

8. The photocurable composition of claim 1 containing a cationically curable monomer, a radically curable monomer, a radical photoinitiator, and a cationic photoinitiator.

9. The photocurable composition of claim 1 wherein the crosslinked polysiloxane material comprises dialkylsiloxane repeating units.

10. The photocurable composition of claim 9 wherein the dimethylsiloxane repeating units.

11. The photocurable composition of claim 1 wherein the crosslinked elastomeric core comprises a polybutadiene material.

12. The photocurable composition of claim 1 wherein the reactive particles have an average particle diameter ranging from 0.01 μm to 50 μm.

13. The photocurable composition of claim 1 wherein the reactive particles are capable of reacting substantially completely to form chemical bonds to a polymer matrix that is formed on curing the photocurable composition.

14. The photocurable composition of claim 1 further comprising a polyether polyol.

* * * * *